US008000110B2

(12) United States Patent
Signer et al.

(10) Patent No.: US 8,000,110 B2
(45) Date of Patent: Aug. 16, 2011

(54) CONNECTOR HOLD DOWN AND METHOD

(75) Inventors: Ryan Signer, Derby, KS (US); John Dunham, Kechi, KS (US)

(73) Assignee: LSI Corporation, Milpitas, CA (US)

( * ) Notice: Subject to any disclaimer, the term of this patent is extended or adjusted under 35 U.S.C. 154(b) by 90 days.

(21) Appl. No.: 12/077,960

(22) Filed: Mar. 24, 2008

(65) Prior Publication Data

US 2009/0237906 A1 Sep. 24, 2009

(51) Int. Cl.
*H05K 7/02* (2006.01)

(52) U.S. Cl. ........ 361/807; 361/775; 361/800; 361/816; 361/818; 174/359; 439/247; 439/326; 439/466; 439/567; 439/607.4

(58) Field of Classification Search .................. 361/807, 361/800, 816, 818, 775; 174/359; 439/247, 439/326, 466, 567, 607
See application file for complete search history.

(56) References Cited

U.S. PATENT DOCUMENTS 4,535,567 A * 8/1985 Seaborn ........................ 451/317
4,563,810 A * 1/1986 Adlon et al. .................... 29/749
4,845,592 A * 7/1989 Himes et al. .................. 361/775
4,973,268 A * 11/1990 Smith et al. ................... 439/595
5,209,675 A * 5/1993 Korsunsky .................... 439/326
5,334,049 A * 8/1994 Kachlic et al. ................ 439/567
5,470,259 A * 11/1995 Kaufman et al. ............. 439/607
6,053,767 A * 4/2000 Copper et al. ................ 439/567
6,053,773 A * 4/2000 Wu .............................. 439/609
6,095,862 A 8/2000 Doye et al. .................... 439/607
6,179,642 B1 * 1/2001 Hwang ......................... 439/358
6,319,062 B1 * 11/2001 Ma et al. ....................... 439/607
6,364,709 B1 4/2002 Jones ........................... 439/607
6,524,134 B2 * 2/2003 Flickinger et al. ............ 439/607
7,059,882 B2 * 6/2006 Sugita et al. .................. 439/247
7,168,986 B1 * 1/2007 Peng ............................ 439/607
7,297,005 B1 * 11/2007 Zaderej et al. .................. 439/74
7,309,254 B2 * 12/2007 Suzuki et al. ................. 439/567
7,390,212 B1 * 6/2008 Yang ............................ 439/490
7,397,251 B2 * 7/2008 King et al. .................... 324/538
7,410,391 B2 * 8/2008 Wan et al. ..................... 439/607
7,581,980 B2 * 9/2009 Chiu et al. .................... 439/466

* cited by examiner

*Primary Examiner* — Xiaoliang Chen
(74) *Attorney, Agent, or Firm* — Suiter Swantz pc llo

(57) ABSTRACT

A device may include a connector receptacle coupled to a motherboard; a connector hold-down disposed adjacent to the connector receptacle; and/or a connector cage coupled to the motherboard and covering the connector receptacle and connector hold-down. Additionally, a computer system utilizing a connector hold-down and a method utilizing a connector hold-down are disclosed.

7 Claims, 5 Drawing Sheets

CONNECTOR HOLD DOWN AND METHOD

TECHNICAL FIELD

The present disclosure generally relates to the field of computer systems and configurations, and more particularly to a connector hold down for a connector assembly.

BACKGROUND

An electrical connector may be utilized in a wide variety of applications. Electrical connectors may join two lengths of flexible wire or cable, or may connect a wire or cable to an electrical terminal. Many computer systems utilize a plug and socket connector, such as on a motherboard. Plug and socket connectors may include a male plug and a female socket

SUMMARY

A device may include a connector receptacle coupled to a motherboard; a connector hold-down disposed adjacent to the connector receptacle; and/or a connector cage coupled to the motherboard and covering the connector receptacle and connector hold-down.

A computer system may include a motherboard; a connector receptacle coupled to the motherboard; a connector hold-down disposed adjacent to the connector receptacle; and/or a connector cage coupled to the motherboard and covering the connector receptacle and connector hold-down.

A method may include coupling a connector receptacle with a motherboard; placing a connector hold-down adjacent to the connector receptacle; and/or coupling a connector cage with the motherboard where the connector cage substantially covers the connector receptacle and the connector hold-down.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
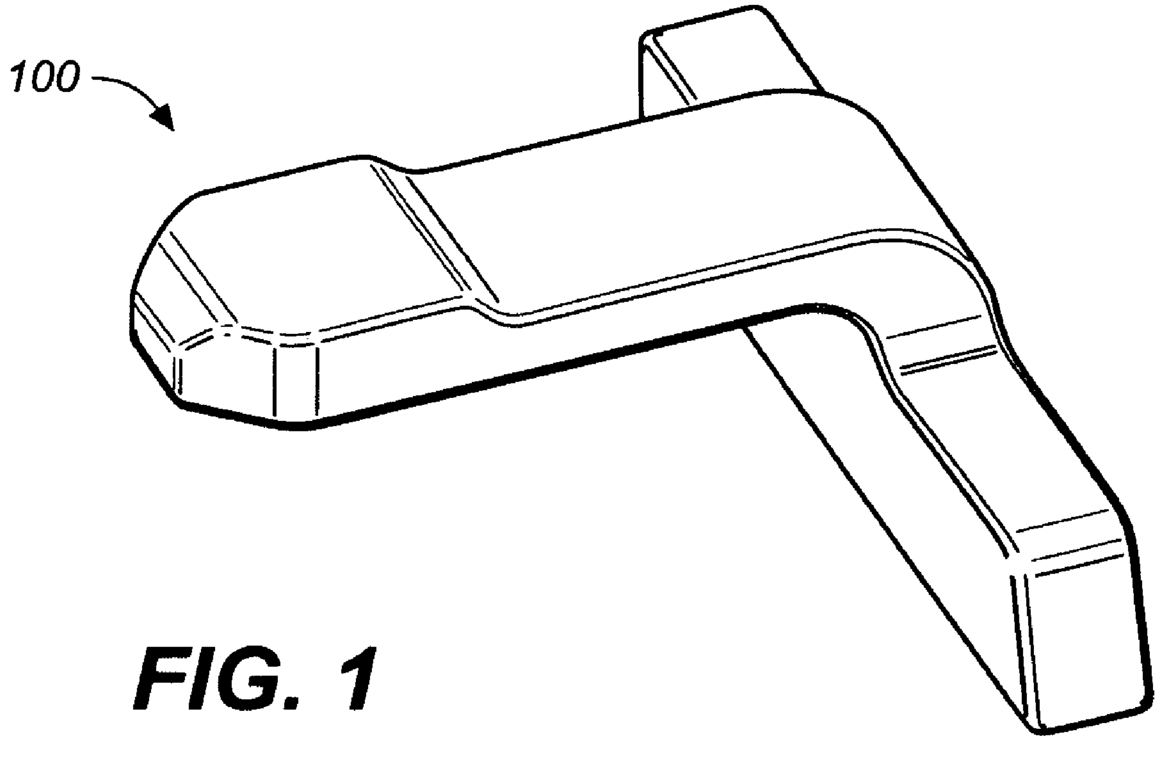
FIG. 1 is an isometric view illustrating a connector hold-down.
Figure 2:
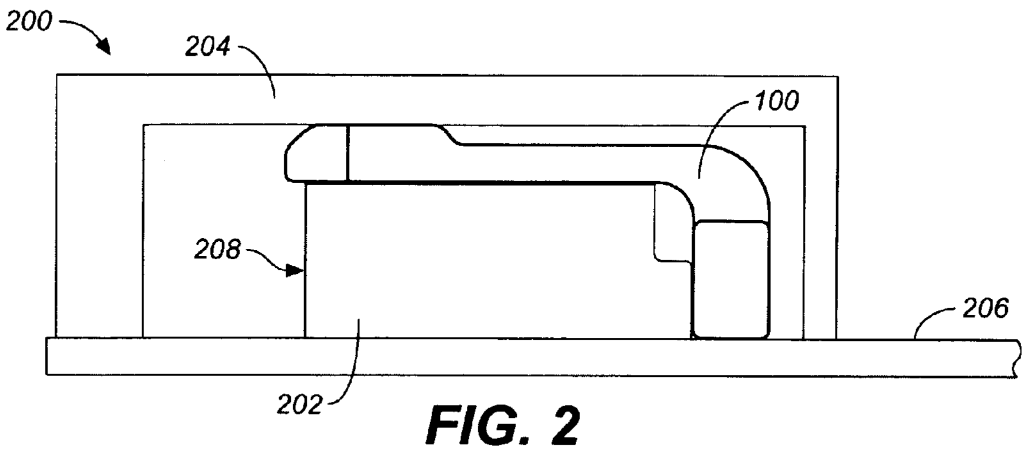
FIG. 2 is a side elevation view illustrating a connector hold-down assembly.
Figure 3:
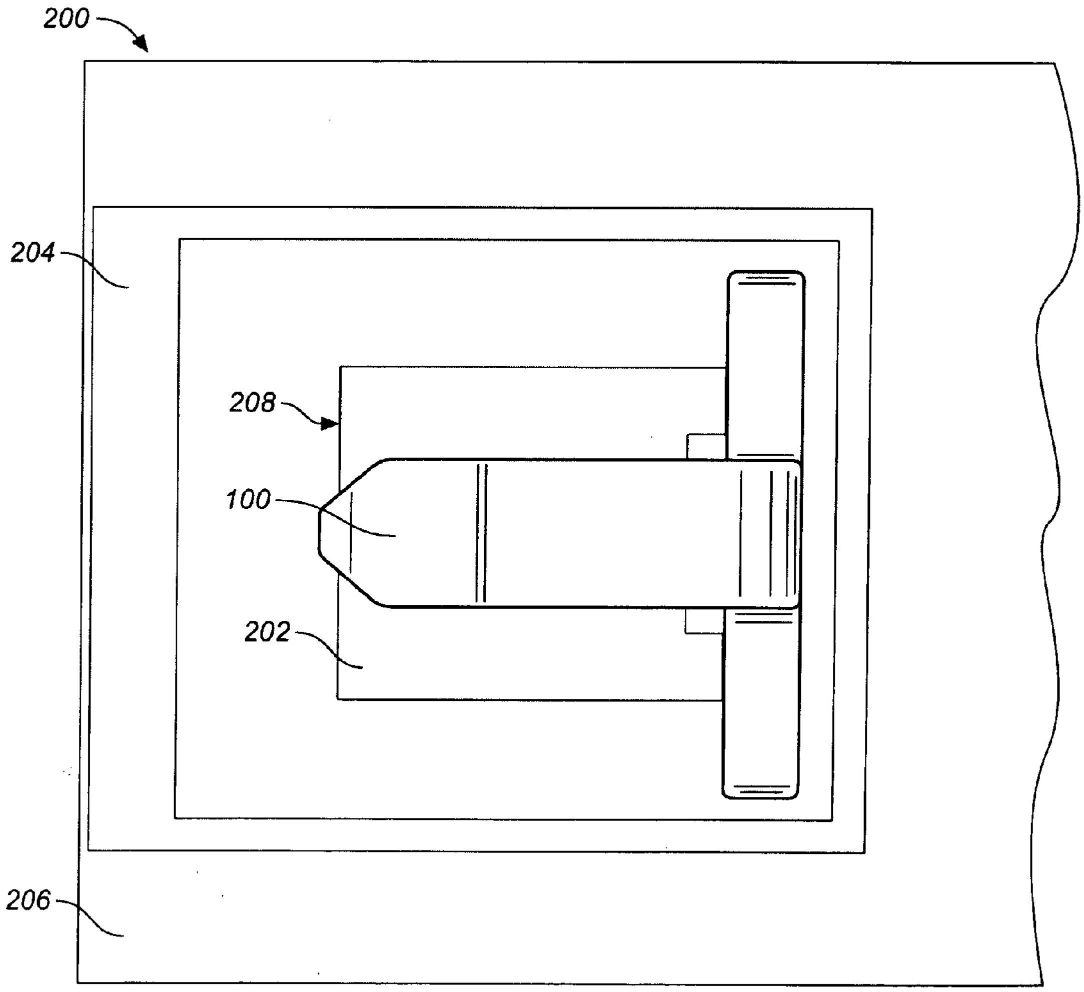
FIG. 3 is a top plan view illustrating a connector hold-down assembly.
Figure 4:
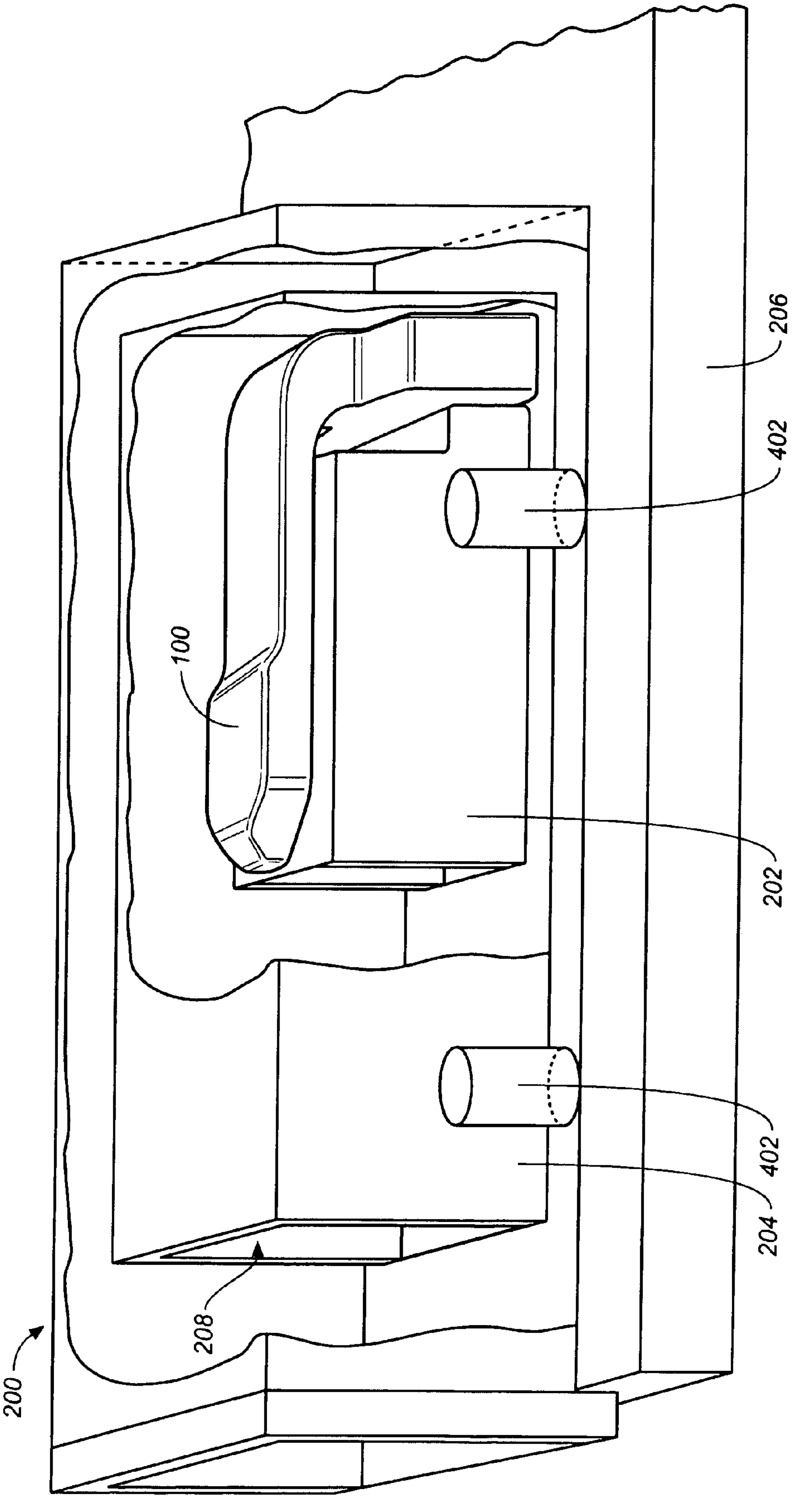
FIG. 4 is a partial isometric view illustrating a connector hold-down assembly.

Reference will now be made in detail to the subject matter disclosed, which is illustrated in the accompanying drawings.

Referring generally to FIGS. 1 through 4, a connector hold-down assembly 200, a computer system utilizing a connector hold-down assembly 200, and a method for providing a connector hold-down assembly 200 are described. The connector hold-down assembly 200 may include a connector receptacle 202, a connector hold-down 100, and/or a connector cage 204. The computer system may include a motherboard 206, a connector receptacle 202, a connector hold-down 100, and/or a connector cage 204.

The connector hold-down assembly 200 may include a connector receptacle 202, a connector hold-down 100, and/or a connector cage 204. A connector receptacle 202 may include a socket portion of a plug and socket connector. A socket portion of a plug and socket connector may include any female connector portion of an electrical connector. Some examples of a plug and socket connector may include a serial attached small computer system interface (SAS) connector, a universal serial bus (USB) connector, a power connector, such as an AC power plug and/or a DC power plug, a cable connector, a wire connector, and/or a bayonet Neill-Concelman (BNC) connector, etc. Additionally, the connector receptacle 202 may include means for ejecting a plug portion of a plug and socket connector. For example, means for ejecting a plug portion may include a spring assembly configured to exert an ejection force on the plug portion.

A connector hold-down 100 may include a device configured to generally wedge between at least one side and/or surface of a connector receptacle 202 and a connector cage 204. For example, the connector hold-down 100 may include a generally longitudinal support member having a hold-down portion extending generally perpendicular from the generally longitudinal support member and generally parallel to the plane of the motherboard 206. The connector hold-down 100 may include materials such as a plastic, a polymer, a phenolic material such as phenolic paper, fiberglass based material, and/or nonconductive materials. Additionally, the connector hold-down 100 may be adapted to be disposed behind and/or between a connector receptacle 202 and a connector cage 204 and wrap around onto a separate surface of the connector. The connector hold-down 100 may be adapted to be self-locating. For example, the connector hold-down 100 may self-locate by utilizing tapers disposed on the surfaces and corners of the connector hold-down 100. Once the connector hold-down 100 is positioned and the connector cage 204 is fastened in place, the height of the connector hold-down 100 and/or a portion of the connector hold-down 100, such a hold-down portion extending generally perpendicular from the generally longitudinal support member, may provide an interference fit between the connector receptacle 202 and the connector cage 204 ensuring the connector hold-down 100 is not repositionable.

A connector cage 204 may include any frame and/or structure configured for providing an enclosure adapted to receive a plug portion of a plug and socket connector and/or protect and cover a connector receptacle 202. For example, a connector cage 204 may include two sidewalls, a top plate, an open end, and/or a rear plate where the connector cage 204 is formed from a single piece of material and coupled with a motherboard 206 and/or other surface. Additionally, the connector cage 204 may be formed from multiple pieces and/or parts. The connector cage 204 may include different materials and/or compositions, such as a polymer, a plastic, and/or a metal. At least one cage mount 420 may be utilized for coupling a connector cage 204 to a motherboard 206 and/or some other surface. A cage mount 420 may include any means for fastening and/or securing the connector cage 204 to a motherboard 206 and/or some other surface. For example, a cage mount 420 may include a portion of the connector cage 204 adapted to provide a holder for a fastening device, such as a screw and/or bolt. Additionally, the connector cage 204 may include a shielded connector cage 204. A shielded connector cage 204 may include shielding means for providing protection from electromagnetic interference (EMI). EMI may include a disturbance that may affect an electrical circuit due to electromagnetic radiation emitted from an external source. The disturbance may interrupt, obstruct, or otherwise degrade or limit effective performance of the circuit. The source may include any object, artificial or natural, that may carry a rapidly changing electrical current, such as an electrical circuit. Shielding means may include the utilization of sheet metal, metal mesh, metal foam, and/or a coating, such as a metallic ink or similar material.

A computer system may include a motherboard 206, a connector receptacle 202, a connector hold-down 100, and/or a connector cage 204. A motherboard 206 may include a central or primary circuit board making up a complex electronic system. A motherboard 206 may provide the electrical connections by which the other components of the system communicate and may contain the central processing unit, other subsystems such as real time clock, and/or some peripheral interfaces. For example, a computer system may include a motherboard 206 including a processor and a memory module, a connector receptacle configured for providing power to the motherboard, a connector cage configured for covering the connector receptacle, and a connector hold-down adapted to provide an interference fit and/or wedge between the connector receptacle and the connector cage for securing the connector receptacle.

Figure 5:
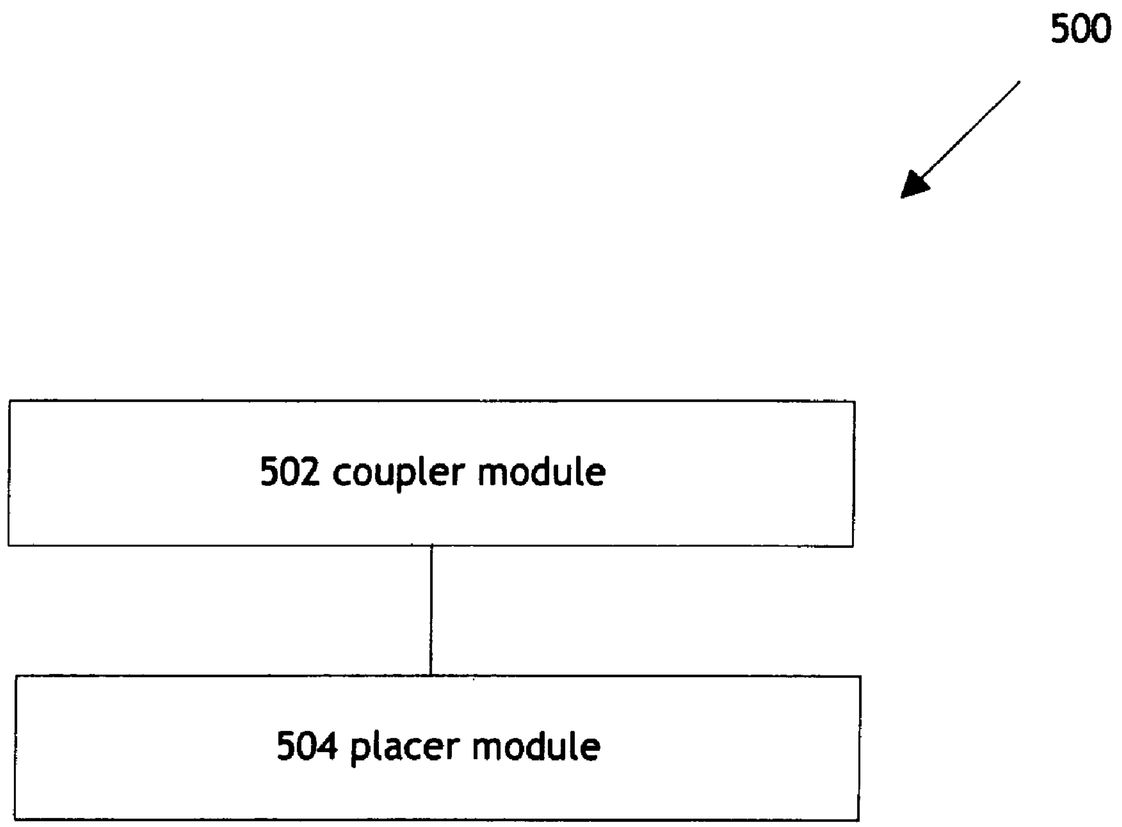
FIG. 5 illustrates an exemplary environment in which one or more technologies may be implemented.

Referring to FIG. 5, a system 500 for coupling a connector receptacle with a motherboard, placing a connector hold-down adjacent to the connector receptacle and/or coupling a connector cage with the motherboard where the connector cage substantially covers the connector receptacle and the connector hold-down is illustrated. The system 500 may include coupler module 502 and/or placer module 504. System 500 generally represents instrumentality for coupling a connector receptacle with a motherboard, placing a connector hold-down adjacent to the connector receptacle and/or coupling a connector cage with the motherboard where the connector cage substantially covers the connector receptacle and the connector hold-down. The steps of coupling a connector receptacle with a motherboard, placing a connector hold-down adjacent to the connector receptacle and/or coupling a connector cage with the motherboard where the connector cage substantially covers the connector receptacle and the connector hold-down may be accomplished electronically (e.g. with a set of interconnected electrical components, an integrated circuit, and/or a computer processor, etc.) and/or mechanically (e.g. an assembly line, a robotic arm, etc.).

Figure 6:
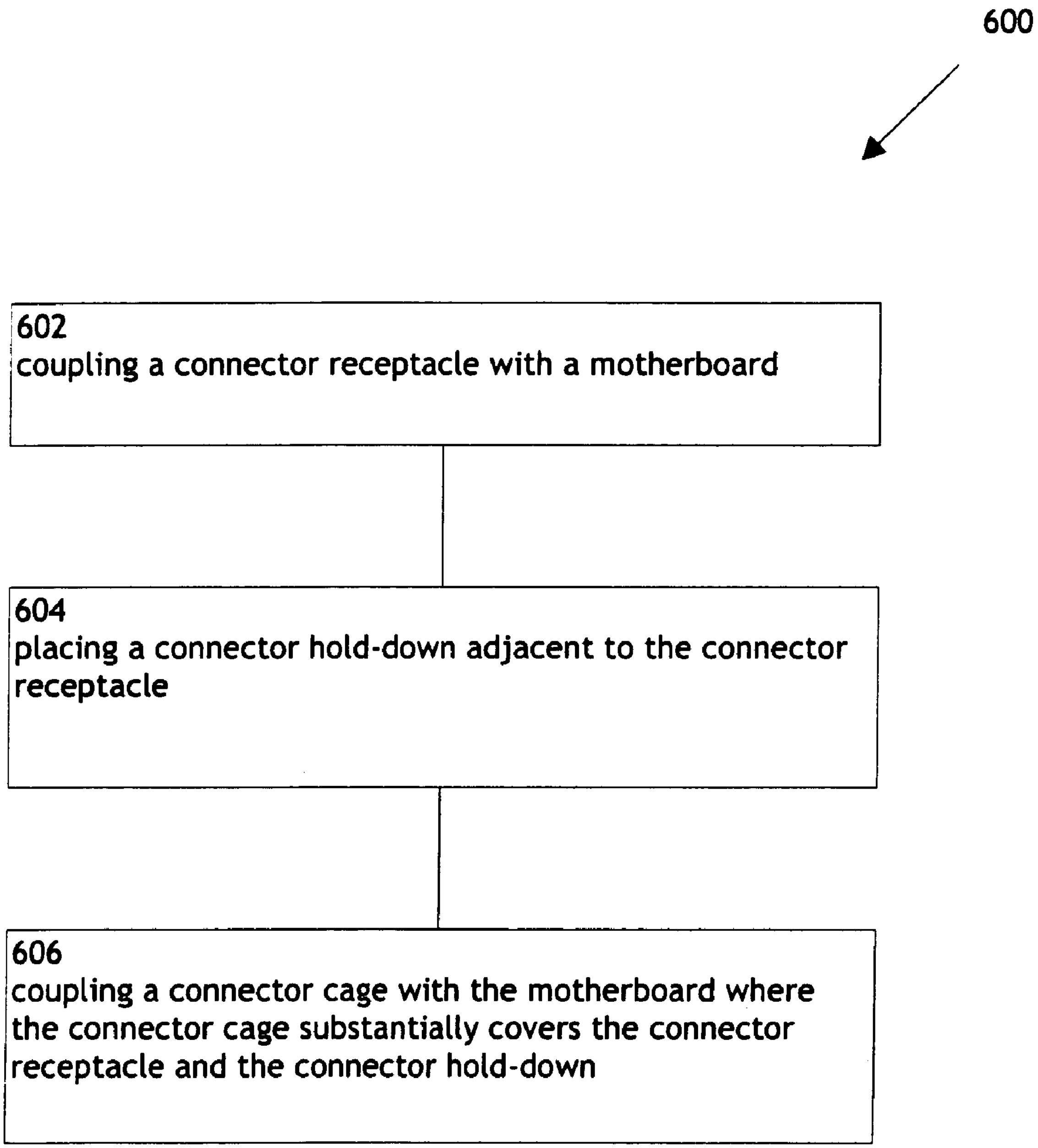
FIG. 6 illustrates an operational flow representing example operations related to providing a connector hold-down assembly.

Referring to FIG. 6, methods for providing a connector hold-down assembly 200 and/or a computer system utilizing a connector hold-down assembly 200 are disclosed. FIG. 6 illustrates an operational flow 600 representing example operations related to coupling a connector receptacle with a motherboard, placing a connector hold-down adjacent to the connector receptacle and/or coupling a connector cage with the motherboard where the connector cage substantially covers the connector receptacle and the connector hold-down. In FIG. 6 and in following figures that include various examples of operational flows, discussion and explanation may be provided with respect to the above-described examples of FIGS. 1 through 5, and/or with respect to other examples and contexts. However, it should be understood that the operational flows may be executed in a number of other environments and contexts, and/or in modified versions of FIGS. 1 through 6. Also, although the various operational flows are presented in the sequence(s) illustrated, it should be understood that the various operations may be performed in other orders than those which are illustrated, or may be performed concurrently.

After a start operation, the operational flow 600 moves to a coupling operation 602, where coupling a connector receptacle with a motherboard may occur. For example, as generally shown in FIGS. 1 through 4, a connector receptacle may be coupled with a motherboard. Coupling operation 602 may be conducted in an automated fashion such as, for example, by an automated coupler module 502 (e.g. a robotic arm and/or automated production line configured to couple a connector receptacle 202 with a motherboard 206), such as those commonly found in the manufacturing arts.

Then, in a placing operation 604, placing a connector hold-down adjacent to the connector receptacle may occur. For example, as shown in FIGS. 1 through 4, a connector hold-down may be placed adjacent to the connector receptacle. Placing operation 604 may be conducted in an automated fashion such as, for example, by an automated placer module 504 (e.g. a robotic arm and/or automated production line configured to place a connector hold-down 100 adjacent to the connector receptacle 202) such as those commonly found in the manufacturing arts.

Then, in a coupling operation 606, coupling a connector cage with the motherboard where the connector cage substantially covers the connector receptacle and the connector hold-down may occur. For example, as shown in FIGS. 1 through 4, a connector cage may be coupled with the motherboard where the connector cage substantially covers the connector receptacle and the connector hold-down. Coupling operation 606 may be conducted in an automated fashion such as, for example, by an automated coupler module 502 (e.g. a robotic arm and/or automated production line configured to couple a connector cage 204 with the motherboard 206 where the connector cage 204 substantially covers the connector receptacle 202 and the connector hold-down 100) such as those commonly found in the manufacturing arts.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An apparatus, comprising:

a motherboard;

a connector receptacle coupled to the motherboard, said connector receptacle comprises a socket connector configured to receive a plug;

a shielded connector cage, the shielded connector cage is coupled to the motherboard and covers the connector receptacle; and a nonconductive connector hold-down disposed adjacent to the connector receptacle, the nonconductive connector hold-down includes a hold-down portion extending perpendicular from a support member and extending parallel to the motherboard, the hold-down portion including at least one tapered side, the nonconductive connector hold-down is configured to wedge between the connector receptacle and the shielded connector cage to provide an interference fit for said connector receptacle.

2. The apparatus in claim 1, wherein the motherboard comprises;

at least one of a processor and a memory module.

3. The apparatus in claim 1, wherein the connector receptacle coupled to the motherboard comprises:

a serial attached small apparatus interface (SAS).

4. The apparatus in claim 1, wherein the nonconductive connector hold-down includes at least one of a polymer connector hold-down or plastic connector hold-down.

5. The apparatus in claim 1, wherein the nonconductive connector hold-down disposed adjacent to the connector receptacle comprises:

the connector hold-down disposed adjacent to at least two sides of the connector receptacle.

6. The apparatus in claim 1, wherein the nonconductive connector hold-down disposed adjacent to the connector receptacle comprises:

the connector hold-down configured to be disposed between the connector cage and a connector receptacle first side, where the connector hold-down wraps from the connector receptacle first side to a connector receptacle second side.

7. The apparatus in claim 1, wherein the connector cage coupled to the motherboard and covering the connector receptacle and connector hold-down comprises:

a plug ejection module.

* * * * *